(12) United States Patent
Su

(10) Patent No.: US 6,646,373 B1
(45) Date of Patent: Nov. 11, 2003

(54) ORGANIC ELECTRO-LUMINESCENCE DEVICE

(75) Inventor: Chih-Hung Su, Kaohsung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/064,241

(22) Filed: Jun. 25, 2002

(30) Foreign Application Priority Data

May 7, 2002 (TW) ........................................ 91109411 A

(51) Int. Cl.[7] .............................................. H05B 33/00
(52) U.S. Cl. ...................... 313/512; 313/504; 313/506; 313/509; 428/917
(58) Field of Search ................................ 313/512, 506, 313/509, 504; 315/169.3; 428/690, 917

(56) References Cited

U.S. PATENT DOCUMENTS

| 5,427,858 | A | 6/1995 | Nakamura et al. .......... 428/421 |
| 5,734,225 | A | 3/1998 | Biebuyck et al. ........... 313/512 |
| 5,811,177 | A | 9/1998 | Shi et al. .................... 428/209 |
| 5,895,228 | A | 4/1999 | Biebuyck et al. ............. 438/99 |
| 5,952,778 | A | 9/1999 | Haskal et al. ............... 313/504 |
| 6,150,187 | A | 11/2000 | Zyung et al. ................. 438/26 |
| 6,198,217 | B1 | 3/2001 | Suzuki et al. ............... 313/504 |
| 6,268,071 | B1 * | 7/2001 | Yasukawa et al. .......... 313/512 |

* cited by examiner

Primary Examiner—Ashok Patel
(74) Attorney, Agent, or Firm—Jiang Chyun IP Office

(57) ABSTRACT

An organic electro-luminescence device comprising a substrate, an anode, a light-emitting layer, a cathode and a protection layer. The anode is configured over the substrate. The light-emitting layer is configured over the anode layer. The cathode is configured over the light-emitting layer. The protection layer is configured over the substrate, around the substrate and the anode as well as around the light-emitting layer and the cathode. The protection layer is made from a metallocene based cyclic olefin copolymer.

24 Claims, 3 Drawing Sheets

ORGANIC ELECTRO-LUMINESCENCE DEVICE

CROSS REFERENCE TO RELATED APPLICATIONS

This application claims the priority benefit of Taiwan application serial no. 91109411, filed May 7, 2002.

BACKGROUND OF INVENTION

1. Field of Invention

The present invention relates to an organic electro-luminescence device. More particularly, the present invention relates to an organic electro-luminescence device having a highly transparent, low oxygen and moisture penetrating protective layer.

2. Description of Related Art

Lightweight and high performance displays such as liquid crystal displays are being rapidly developed. However, liquid crystal displays still have some performance problems that need to be tackled, such as a narrow viewing angle, a slow response to signal and a need to have background lighting. Hence, a liquid crystal display is unsuitable for high-speed image animation and wastes a lot of energy powering the background lighting. There is additional difficulty in producing a large liquid crystal display panel.

At present, a new technology for forming a flat panel display capable of addressing all the intrinsic problems of a conventional liquid crystal display has been developed. The new flat panel display is the so-called organic electro-luminescence display (OED). OED is a display device formed using an organic light-emitting material. Each OED device comprises a pair of electrodes and a light-emitting layer. The light-emitting layer contains organic light-emitting material. When an electric current passes between the cathode to the anode of the OED device, light is emitted through the light-emitting mechanism.

Organic electro-luminescence devices may be classified further into organic light emitting diode (OLED) and polymer light emitting diode (PLED). The major difference between the two devices lies in the material application within the light-emitting layer. The light-emitting layer in the organic light emitting diode uses small light-emitting organic molecules. On the other hand, the light-emitting layer in the polymer light emitting diode uses large light-emitting molecules.

In general, an electro-luminescence device is enclosed by a protective layermade from material such as glass, metal, plastic or other high molecular weight polymer. For example, high molecular weight polymer containing fluorine is used in U.S. Pat. No. 5,427,858, the chemical siloxane is used in U.S. Pat. Nos. 5,734,225 and 5,895,228, epoxy resin or polyethylene is used in U.S. Pat. No. 5,811,177, the chemicals polysiloxane, teflon and branching polyolefin are used in U.S. Pat. No. 5,952,778, the chemicals polyvinyl alcohol, polyvinyl acetate derivatives and polyethylene are used in U.S. Pat. No. 6,150,187, the chemicals acrylic polymer, silicon dioxide and silicon carbide are used in U.S. Pat. No. 6,198,217 and diamond shaped carbon, silicon oxide, silicon nitride or metallic material are used in U.S. Pat. No. 6,198,217.

However, if the organic electro-luminescence device has a top emitting structure (in other words, reflective type with light emitting from the anode), the protective layer must have high transparency for visible light. In addition, the protective layer must block out unwanted contaminants such as moisture and oxygen. In brief, the protective layer has to have high transparency and low permeability for moisture and oxygen. So far, none of the aforementioned materials for forming the protective layer has a high light transparency and a low permeability to moisture and oxygen at the same time.

SUMMARY OF INVENTION

Accordingly, one object of the present invention is to provide an organic electro-luminescence device having a metallocene based cyclic olefin copolymer protective layer such that the protective layer of the electro-luminescence device is highly transparent to light and has a low permeability to both moisture and oxygen.

A second object of this invention is to provides an organic electro-luminescence device having a metallocene based cyclic olefin copolymer substrate board such that the substrate board of the electro-luminescence device is highly transparent to light, and flexible in addition to having a low permeability to moisture and oxygen.

A third object of this invention is to provide an organic electro-luminescence device having a metallocene based cyclic olefin copolymer substrate board and protective layer such that, in addition to providing a substrate board and protective layer having a high light transparency, flexibility and a low permeability to moisture and oxygen, the substrate board and the protective layer also have higher adhesive strength and a lower coefficient of thermal expansion (CTE).

To achieve these and other advantages and in accordance with the purpose of the invention, as embodied and broadly described herein, the invention provides an organic electro-luminescence device. The organic electro-luminescence device comprises a substrate board, a cathode, a light-emitting layer, an anode and a protective layer. The cathode is configured over the substrate board and the light-emitting layer is configured over the cathode. The anode is configured over the light-emitting layer and the protective layer is configured around the substrate board and the anode as well as around the light-emitting layer and the cathode. The protective layer is made from a metallocene based cyclic olefin copolymer.

This invention also provides a second type of organic electro-luminescence device. The organic electro-luminescence device comprises a substrate board, a cathode, a light-emitting layer, an anode and a protective layer. The cathode is configured over the substrate board and the light-emitting layer is configured over the cathode. The anode is configured over the light-emitting layer and the protective layer is configured around the substrate board and the anode as well as around the light-emitting layer and the cathode. The substrate board is made from a metallocene based cyclic olefin copolymer.

This invention also provides a third type of organic electro-luminescence device. The organic electro-luminescence device comprises a substrate board, a cathode, a light-emitting layer, an anode and a protective layer. The cathode is configured over the substrate board and the light-emitting layer is configured over the cathode. The anode is configured over the light-emitting layer and the protective layer is configured around the substrate board and the anode as well as around the light-emitting layer and the cathode. Both the protective layer and the substrate board are made from a metallocene based cyclic olefin copolymer.

In this invention, a metallocene based cyclic olefin copolymer is used to form the protection layer. Thus, the protective layer has a high light transparency and a low permeability to moisture and oxygen. Aside from the protective properties, the protective layer is also an effective medium for dissipating light from a reflective anode emitting (top section emitting) type of organic electro-luminescence device.

The metallocene based cyclic olefin copolymer may also be used to form the substrate board of an organic electro-luminescence device. The substrate board is flexible in addition to having a high light transparency and relatively impermeable to moisture and oxygen. Thus, the substrate board has ideal properties as a component for a light penetrating and anode emitting (bottom section emitting) type of organic electro-luminescence device.

In addition, the metallocene based cyclic olefin copolymer may also be used to form both the substrate board and the protective layer of an organic electro-luminescence device. Aside from having a high light transparency and flexibility and a low permeability to moisture and oxygen and high flexibility, the substrate board and the protective layer also have a higher adhesive strength and a lower coefficient of thermal expansion.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
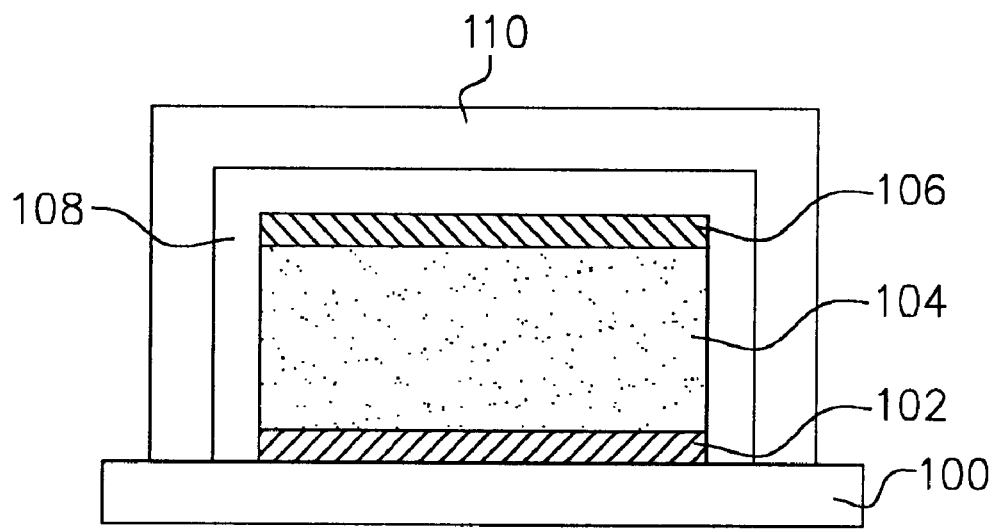
FIG. 1 is a schematic cross-sectional view of an organic electro-luminescence device fabricated according to a first embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic cross-sectional view of an organic electro-luminescence device fabricated according to a first embodiment of this invention. As shown in FIG. 1, the organic electro-luminescence device has a single-layered structure. The device includes a transparent substrate 100, an anode 102, a light-emitting layer 104, a cathode 106 and a protection layer 110. To form the organic electro-luminescence device, an anode 102, a light-emitting layer 104 and a cathode 106 are sequentially formed over the transparent substrate 100. Thereafter, the protection layer 110 is formed over the transparent substrate 100 and around the cathode 106 as well as around the light-emitting layer 104 and the anode 102 so that the organic electro-luminescence device is encapsulated.

The transparent substrate 100 is a glass panel, a plastic panel or a flexible panel, for example. The anode 102 is configured over the transparent substrate 100. The anode 102 is the place for injecting electron holes into the light-emitting layer 104 in an efficient manner. Thus, the anode 102 preferably has a work function greater than 4.5eV. Material for forming the anode 102 includes, for example, indium-tin-oxide (ITO), tin oxide, gold, silver, platinum or copper.

The light-emitting layer 104 is configured over the anode layer 102. The light-emitting layer 104 can be a light-emitting polymeric layer or a light-emitting layer of small organic molecules formed, for example, by spin coating. The light-emitting layer 104 may produce light of different colors according to the energy gap between the base state and the activated state of a particular material.

The cathode 106 is configured over the light-emitting layer 104 for injecting electrons into the light-emitting layer 104 in an efficient manner. The cathode 106 can be a single conductive layer having a high work function such as an aluminum layer or a silver layer. Alternatively, the cathode 106 can be a double conductive layer such as a lithium fluoride/aluminum layer, a barium/aluminum layer or a magnesium/silver layer. The cathode layer 106 is formed, for example, by vacuum evaporation.

The protection layer 110 is configured over the substrate 100 and around the dielectric layer 108 for encapsulating the entire device. The protection layer 110 is formed using a material having a high light transparency and a low permeability to both moisture and oxygen such as a metallocene based cyclic olefin copolymer. The protection layer 110 is formed, for example, by spin coating copolymer material over the device or evaporating single copolymer over the device followed by heating to form the copolymer layer. Alternatively, the protection layer 110 is formed by heating target copolymer material and sputtering the copolymer material over the device under a vacuum environment with a surface temperature of the device (substrate) not exceeding 100° C. The protection layer 110 can also be formed by casting the copolymer material over the device or using a plasma-enhanced chemical vapor deposition to polymerize single copolymers into a layer above the device. A roll-to-roll method may also be used. In the roll-to-roll method, a copolymer material layer shaped into a plastic film is printed over the device using rollers.

Since the metallocene based cyclic olefin copolymer has a high light transparency and a low permeability to moisture and oxygen, the protection layer 110 provides strong protection to the organic electro-luminescence device. Aside from the protective properties, the protective layer is also an ideal medium for transmitting light away from a reflective, anode emission (top section emitting) type of organic electro-luminescence device.

Figure 2:
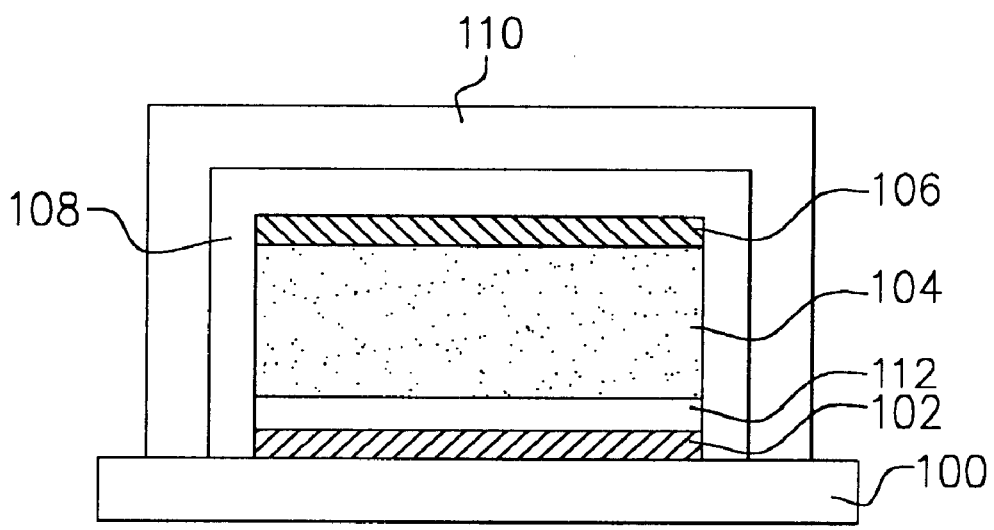
FIG. 2 is a schematic cross-sectional view of an organic electro-luminescence device fabricated according to a second embodiment of this invention.

FIG. 2 is a schematic cross-sectional view of an organic electro-luminescence device fabricated according to a second embodiment of this invention. As shown in FIG. 2, the organic electro-luminescence device has a double-layered structure. Aside from all the films in FIG. 1, an electron hole transmission layer 11 2 is also formed between the light-emitting layer 104 and the anode 102.

Figure 3:
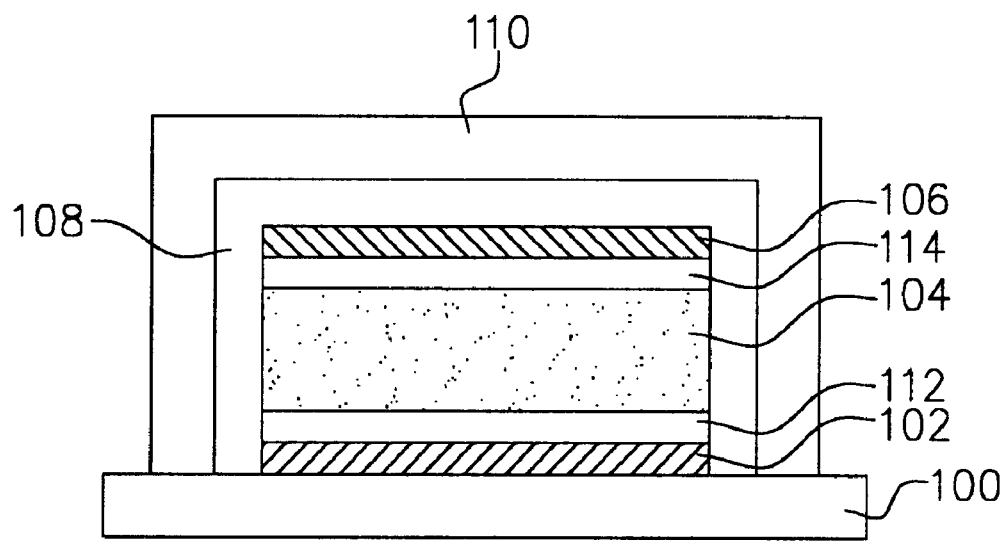
FIG. 3 is a schematic cross-sectional view of an organic electro-luminescence device fabricated according to a third embodiment of this invention.
Figure 4:
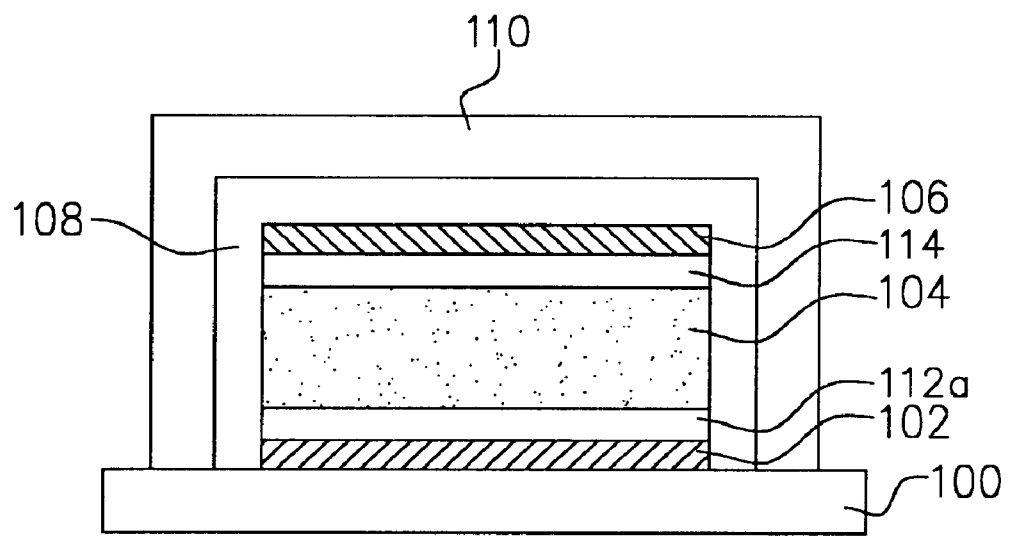
FIG. 4 is a schematic cross-sectional view of an organic electro-luminescence device fabricated according to a fourth embodiment of this invention.

This invention also provides an organic electro-luminescence device having a three-layered structure (as shown in FIGS. 3 and 4). In the three-layered organic electro-luminescence device structure in FIG. 3, aside from an electron hole transmission layer 112 between the light-emitting layer 104 and the anode 102, an electron transmission layer 114 is also formed between the light-emitting layer 104 and the cathode 106. FIG. 4 shows an alternative three-layered organic electro-luminescence device. An electron transmission layer 114 is formed between the light-emitting layer 104 and the cathode 106 while an electron hole injections layer 112a is formed between the light-emitting layer 104 and the anode 102.

Figure 5:
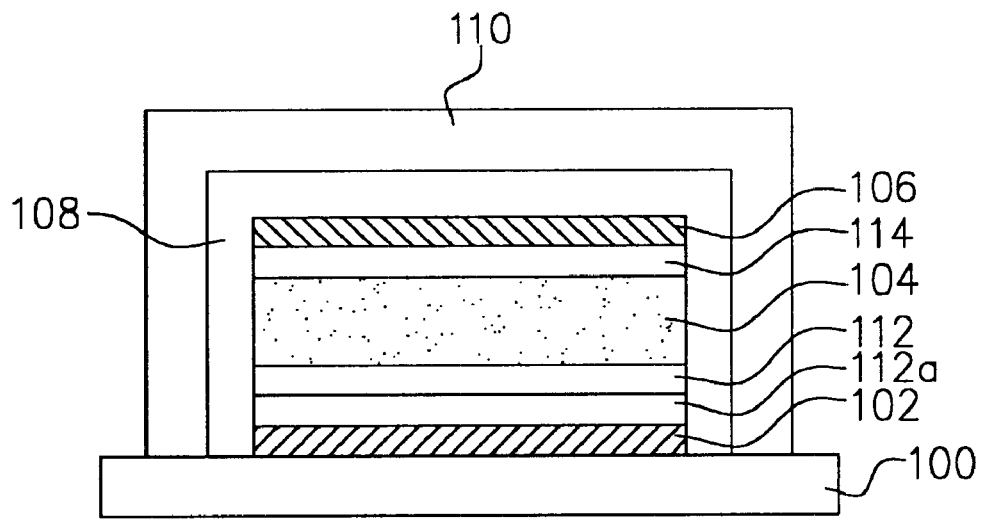
FIG. 5 is a schematic cross-sectional view of an organic electro-luminescence device fabricated according to a fifth embodiment of this invention.

This invention also provides a four-layered organic light emitting diode as shown in FIG. 5. In FIG. 5, an electron transmission layer 114 is configured between the light-emitting layer 104 and the cathode 106 and an electron hole transmission layer 112 is configured between the light-emitting layer 104 and the anode 102. Furthermore, an electron hole injection layer 112a is configured between the anode 102 and the electron hole transmission layer 112.

Figure 6:
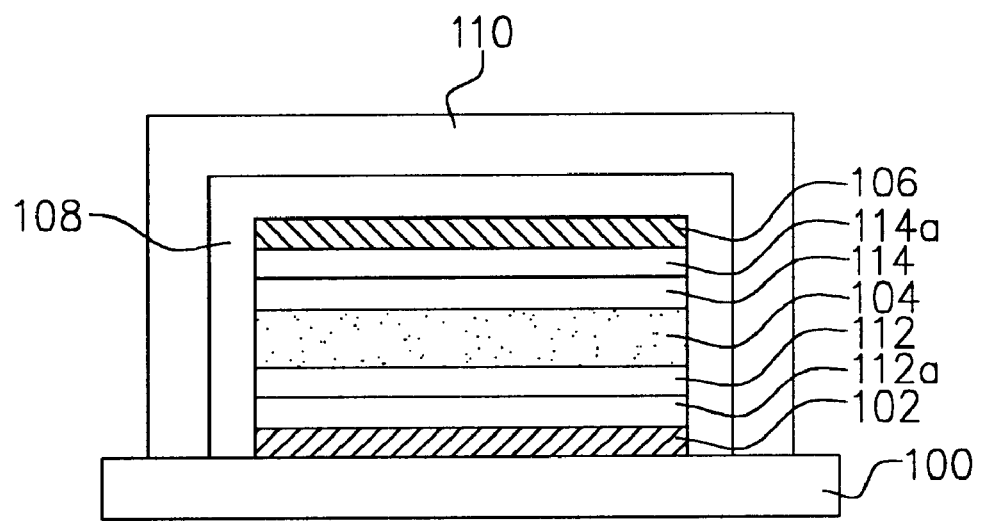
FIG. 6 is a schematic cross-sectional view of an organic electro-luminescence device fabricated according to a sixth embodiment of this invention.

The organic light emitting diode according to this invention can have a five-layered structure as shown in FIG. 6. In addition to an electron transmission layer 114 between the light-emitting layer 104 and the cathode 106, an electron injection layer 114a is configured between the electron transmission layer 114 and the cathode 106. Furthermore, in addition to an electron hole transmission layer 112 between the light-emitting layer 104 and the anode 102, an electron hole injection layer 112a is configured between the anode 102 and the electron transmission layer 112.

The electron hole transmission layer 112, the electron transmission layer 114, the electron hole injection layer 112a and the electron injection layer 114a are formed by spin coating, for example.

In all the aforementioned organic electro-luminescence devices (FIGS. 1 to 6), high light transparency and low oxygen/moisture permeability material may be used to fabricate the substrate 100 while conventional material may be used to form the protection layer 110. For example, a metallocene based cyclic olefin copolymer may be used to form the substrate 100. Metallocene based cyclic olefin copolymer is a suitable material for forming a substrate because the material is also highly flexible aside from having a high light transparency and a low oxygen/moisture permeability. A metallocene based cyclic olefin copolymer substrate has superior properties over a conventional substrate and hence is often used as a component in a light penetrating and anode emitting (bottom section emitting) type of organic electro-luminescence device.

Moreover, in all the aforementioned organic electro-luminescence devices (FIGS. 1 to 6), high light transparency and low oxygen/moisture permeability material may be used to fabricate both the substrate 100 and the protection layer 110. For example, a metallocene based cyclic olefin copolymer may be used to form the substrate 100 and the protection layer 110 of the organic electro-luminescence device. Using metallocene based cyclic olefin copolymer material, the substrate 100 and the protection layer 110 not only has a higher transparency, a lower oxygen/moisture permeability and a higher flexibility, but also a better mutual adhesion and a smaller difference in their coefficient of thermal expansion. Hence, an organic electro-luminescence device having such a configuration is advantageous to both cathode emission (light passing type) and anode emission (light reflecting type) of light-emitting devices.

In addition, the aforementioned organic electro-luminescence device structure may include the special function dielectric layer 108 between the organic electro-luminescence stack layer (that is, the stack structure between the anode 102 and the cathode 106) and the protection layer 110.

In Summary, the Invention Includes the Following Advantages:

1. In this invention, a metallocene based cyclic olefin copolymer is used to form the protection layer. Thus, the protective layer has a high light transparency and a low permeability to moisture and oxygen. Aside from the protective properties, the protective layer is also an effective medium for dissipating light from a reflective anode emitting (emission from the top section) type of organic electro-luminescence device.

2. The metallocene based cyclic olefin copolymer may also be used to form the substrate board of an organic electro-luminescence device. The substrate board is flexible in addition to having a high light transparency and relatively impermeable to moisture and oxygen. Thus, the substrate board has ideal properties as a component for a light penetrating and anode emitting (bottom section emission) type of organic electro-luminescence device.

3. The metallocene based cyclic olefin copolymer may also be used to form both the substrate board and the protective layer of an organic electro-luminescence device. Aside from having a high light transparency and flexibility and a low permeability to moisture and oxygen and high flexibility, the substrate board and the protective layer have a higher mutual adhesive strength and a smaller difference in thermal expansion.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic electro-luminescence device, comprising:
   a substrate;
   an anode configured over the substrate;
   a light-emitting layer configured over the cathode;
   a cathode configured over the light-emitting layer; and
   a protection layer configured over the substrate and around the anode as well as around the light-emitting layer and the cathode, wherein the protection layer is made from a metallocene based cyclic olefin copolymer.

2. The device of claim 1, wherein the light-emitting layer includes an organic layer capable of emitting light.

3. The device of claim 1, wherein the light-emitting layer includes a polymer layer capable of emitting light.

4. The device of claim 1, wherein the organic electro-luminescence device further includes an electron hole transmission layer configured between the cathode and the light-emitting layer.

5. The device of claim 1, wherein the organic electro-luminescence device further includes an electron hole injection layer configured between the light-emitting layer and the cathode.

6. The device of claim 1, wherein the organic electro-luminescence device further includes an electron injection layer configured between the anode and the light-emitting layer.

7. The device of claim 1, wherein the organic electro-luminescence device further includes an electron transmission layer configured between the light-emitting layer and the anode.

8. The device of claim 1, wherein the organic electro-luminescence device further includes a dielectric layer configured over the substrate and around the anode, the light-emitting layer, and the cathode and between the protection layer and the anode, light-emitting layer, and cathode.

9. An organic electro-luminescence device, comprising:
   a substrate, wherein the substrate is made from a metallocene based cyclic olefin copolymer;
   an anode configured over the substrate;
   a light-emitting layer configured over the cathode;
   a cathode configured over the light-emitting layer; and
   a protection layer configured over the substrate and around the anode as well as around the light-emitting layer and the cathode.

10. The device of claim 9, wherein the light-emitting layer includes an organic layer capable of emitting light.

11. The device of claim 9, wherein the light-emitting layer includes a polymer layer capable of emitting light.

12. The device of claim 9, wherein the organic electro-luminescence device further includes an electron hole transmission layer configured between the cathode and the light-emitting layer.

13. The device of claim 9, wherein the organic electro-luminescence device further includes an electron hole injection layer configured between the light-emitting layer and the cathode.

14. The device of claim 9, wherein the organic electro-luminescence device further includes an electron injection layer configured between the anode and the light-emitting layer.

15. The device of claim 9, wherein the organic electro-luminescence device further includes an electron transmission layer configured between the light-emitting layer and the anode.

16. The device of claim 9, wherein the organic electro-luminescence device further includes a dielectric layer configured over the substrate and around the anode, the light-emitting layer, and the cathode and between the protection layer and the anode, light-emitting layer, and cathode.

17. An organic electro-luminescence device, comprising:
   a substrate, wherein the substrate is made from a metallocene based cyclic olefin copolymer;
   an anode configured over the substrate;
   a light-emitting layer configured over the cathode;
   a cathode configured over the light-emitting layer; and
   a protection layer configured over the substrate and around the anode as well as around the light-emitting layer and the cathode, wherein the protective layer is made from a metallocene based cyclic olefin copolymer.

18. The device of claim 17, wherein the light-emitting layer includes an organic layer capable of emitting light.

19. The device of claim 17, wherein the light-emitting layer includes a polymer layer capable of emitting light.

20. The device of claim 17, wherein the organic electro-luminescence device further includes an electron hole transmission layer configured between the cathode and the light-emitting layer.

21. The device of claim 17, wherein the organic electro-luminescence device further includes an electron hole injection layer configured between the light-emitting layer and the cathode.

22. The device of claim 17, wherein the organic electro-luminescence device further includes an electron injection layer configured between the anode and the light-emitting layer.

23. The device of claim 17, wherein the organic electro-luminescence device further includes an electron transmission layer configured between the light-emitting layer and the anode.

24. The device of claim 17, wherein the organic electro-luminescence device further includes a dielectric layer configured over the substrate and around the anode, the light-emitting layer, and the cathode and between the protection layer and the anode, light-emitting layer, and cathode.

* * * * *